US 9,991,797 B2

(12) United States Patent
Akahane

(10) Patent No.: US 9,991,797 B2
(45) Date of Patent: Jun. 5, 2018

(54) SEMICONDUCTOR ELEMENT DRIVE APPARATUS

(71) Applicant: FUJI ELECTRIC CO., LTD., Kawasaki-shi, Kanagawa (JP)

(72) Inventor: Masashi Akahane, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days. days.

(21) Appl. No.: 15/333,516

(22) Filed: Oct. 25, 2016

(65) Prior Publication Data

US 2017/0040896 A1 Feb. 9, 2017

Related U.S. Application Data

(63) Continuation of application No. PCT/JP2015/077814, filed on Sep. 30, 2015.

(30) Foreign Application Priority Data

Nov. 6, 2014 (JP) ................. 2014-225902

(51) Int. Cl.
*H02M 3/158* (2006.01)
*H03K 17/18* (2006.01)
(Continued)

(52) U.S. Cl.
CPC ........... *H02M 3/158* (2013.01); *H03K 7/06* (2013.01); *H03K 17/18* (2013.01); *H02M 1/08* (2013.01); *H02M 1/32* (2013.01)

(58) Field of Classification Search
None
See application file for complete search history.

(56) References Cited

U.S. PATENT DOCUMENTS 5,543,994 A    8/1996  Wilhelm et al.
6,522,178 B2*  2/2003  Dubhashi ............ H02M 1/08
                                                      326/83
(Continued)

FOREIGN PATENT DOCUMENTS

EP    1137183 A2    9/2001
JP    H08-330929 A  12/1996
(Continued)

*Primary Examiner* — Henry Lee, III
(74) *Attorney, Agent, or Firm* — Rabin & Berdo, P.C.

(57) ABSTRACT

A semiconductor element drive apparatus for driving first and second semiconductor elements connected to a half-bridge circuit at respectively an upper-level side and a lower-level side of the half-bridge circuit. The semiconductor element drive apparatus includes a high-side circuit and a low-side circuit for respectively driving the first and second semiconductor elements. The high-side circuit includes a voltage drop detection unit that detects an abnormal voltage drop of a voltage of a main power supply, a pulse generation circuit that generates a pulse signal, a frequency of which is decreased in response to the abnormal voltage drop detected by the voltage drop detection unit, and a level-down circuit that receives the pulse signal from the pulse generation circuit, generates an abnormality signal, and transmits the abnormality signal to the low-side circuit, to thereby notify the low-side circuit of the abnormal voltage drop in the high-side circuit.

5 Claims, 13 Drawing Sheets

(51) Int. Cl.
*H03K 7/06* (2006.01)
*H02M 1/32* (2007.01)
*H02M 1/08* (2006.01)

(56) References Cited

U.S. PATENT DOCUMENTS

| | | |
|---|---|---|
| 2001/0024375 A1 | 9/2001 | Kojima et al. |
| 2011/0317315 A1 | 12/2011 | Motohashi et al. |
| 2012/0146782 A1 | 6/2012 | Komatsu et al. |
| 2015/0303797 A1 | 10/2015 | Akahane |

FOREIGN PATENT DOCUMENTS

| | | |
|---|---|---|
| JP | H11-17508 A | 1/1999 |
| JP | 2001-268889 A | 9/2001 |
| JP | 2002-027665 A | 1/2002 |
| JP | 2004-040470 A | 2/2004 |
| JP | 2004-304929 A | 10/2004 |
| JP | 2007-082360 A | 3/2007 |
| JP | 2012-010544 A | 1/2012 |
| JP | 2012-143125 A | 7/2012 |
| WO | WO-2014/208624 A1 | 12/2014 |

\* cited by examiner

| FAILURE TYPES | SIGNAL STATES | PM1 | PM2 | OPERATIONS |
|---|---|---|---|---|
| N/A | OCE = OHE = UVE = 0 | off | off | NO OUTPUT |
| OVERCURRENT | OCE = 1 | off | on | CONTINUOUSLY OUTPUT PULSE PM1 |
| OVERHEAT | OHE = 1 | on | off | CONTINUOUSLY OUTPUT PULSE PM2 |
| LOW VOLTAGE | UVE = 1 | on | off | ALTERNATELY OUTPUT PULSES PM1 AND PM2 |
| | | off | on | |

FIG. 11
(Related Art)

SEMICONDUCTOR ELEMENT DRIVE APPARATUS

CROSS-REFERENCE TO RELATED APPLICATION

This application is a continuation application of International Application PCT/JP2015/077814 filed on Sep. 30, 2015 which designated the U.S., which claims priority to Japanese Patent Application No. 2014-225902, filed on Nov. 6, 2014, the entire contents of which are incorporated herein by reference.

BACKGROUND OF THE INVENTION

1. Field of the Invention

The present invention relates to a high-voltage integrated circuit (HVIC) that drives semiconductor elements connected in a half-bridge circuit and to a semiconductor element drive apparatus that is able to notify a low-side circuit of an abnormality in a high-side circuit via a level-shift circuit (a level-down circuit).

2. Background of the Related Art

An industrial motor, a power supply for a server, or the like is controlled by driving semiconductor elements connected in a half-bridge circuit. An HVIC is used as a control IC for driving these semiconductor elements. The HVIC includes a high-side circuit that controls semiconductor elements on the upper-level side of the half-bridge circuit and a low-side circuit that controls semiconductor elements on the lower-level side of the half-bridge circuit. Namely, the semiconductor elements on both the upper- and lower-level sides can be driven by a single IC. The HVIC outputs a signal for driving the semiconductor elements on the upper- and lower-level sides in response to a control signal from a microcomputer or the like. In particular, the HVIC includes a level-shift circuit for driving semiconductor elements on the upper-level side. Such a level-shift circuit is used for shifting a level of a control signal inputted with a low potential and transmitting the shifted signal to a high potential side.

The HVIC also includes a level-shift circuit (a level-down circuit). When an abnormality occurs in a high-side circuit, the level-shift circuit notifies a low-side circuit of the abnormality (for example, see Japanese Laid-open Patent Publication No. 08-330929 (paragraphs [0003] and [0012] and FIG. 1) and Japanese Laid-open Patent Publication No. 2004-304929 (paragraph [0021] and FIG. 2)).

A metal-oxide-semiconductor (MOS) gate driver circuit discussed in Japanese Laid-open Patent Publication No. 08-330929 includes a level-shift circuit. When an input that exceeds a value given to an external input terminal in a high-side circuit is given, the level-shift circuit notifies a low-side circuit of the input. This level-shift circuit includes a PMOS element. When an abnormality occurs in a high-side circuit, this PMOS element shifts a level of a signal indicating the abnormality. In this way, the signal indicating the abnormality in the high-side circuit is transmitted to the low-side circuit, and an error signal is outputted from an output terminal of the low-side circuit.

Japanese Laid-open Patent Publication No. 2004-304929 also discusses a gate drive circuit. When an abnormality is detected in a high-side circuit, a signal indicating the detection of the abnormality is transmitted to a low-side circuit via a level shift down circuit (a level-down circuit) including PMOS (p-channel metal-oxide-semiconductor field-effect transistor) and NMOS (n-channel metal-oxide-semiconductor field-effect transistor) elements and is outputted to the outside.

According to Japanese Laid-open Patent Publication No. 2004-304929, different types of abnormality, such as an overcurrent flowing through a semiconductor element in the high-side circuit and a drop of a control power supply voltage, can be transmitted to the low-side circuit. However, since signals indicating the different types of abnormality are transmitted by the level-down circuit in the same way, the low-side circuit cannot distinguish the types of abnormality signal transmitted.

There are known techniques directed to such cases in which different types of abnormality signal can be transmitted. According to these techniques, the different types of abnormality signal are distinguished from each other and transmitted differently. More specifically, an alarm signal corresponding to an individual type of abnormality signal is outputted (for example, see Japanese Laid-open Patent Publication No. 2012-10544 and Japanese Laid-open Patent Publication No. 2012-143125). These Japanese Laid-open Patent Publication No. 2012-10544 and Japanese Laid-open Patent Publication No. 2012-143125 discuss a semiconductor device drive circuit including a plurality of protection circuits. Different types of abnormality detected by the plurality of protection circuits are turned into pulse signals having different pulse widths corresponding to the respective protection circuits. In this way, the different types of abnormality detected are distinguished from each other and transmitted differently.

Next, an operation example of the HVIC will be described. In this example, different types of abnormality are detected in the high-side circuit of the HVIC, and the detection results are transmitted to the low-side circuit of the HVIC via a level-down circuit. In the following description, the name of an individual terminal and a voltage, signal, etc. at that terminal are denoted by the same reference character.

FIG. 10 illustrates an example of a configuration of a level-down circuit included in an HVIC. FIG. 11 illustrates functions of a pulse generation circuit. FIG. 12 is a time chart illustrating operations of the pulse generation circuit. FIG. 13 illustrates an output from the pulse generation unit.

As illustrated in FIG. 10, the HVIC includes a high-side circuit 100 and a low-side circuit 200. The HVIC includes a terminal VB via which a high-side power supply voltage VB, which is a main power supply of the high-side circuit 100, is applied to the high-side circuit 100, a terminal OH to which an overheat signal OH is inputted, a terminal OC to which an overcurrent signal OC is inputted, and a terminal VS to which a reference potential VS of the high-side circuit 100 is inputted. In addition, the HVIC includes a terminal VCC via which a low-side power supply voltage VCC, which is a main power supply of the low-side circuit 200, is applied to the low-side circuit 200, a terminal ALM to which an alarm signal ALM is outputted, and a terminal GND to which a reference potential GND of the low-side circuit 200 is inputted.

The high-side circuit 100 includes a control circuit 110 and PMOS elements (high-voltage P channel MOSFETs) PM1 and PM2. The control circuit 110 includes an overheat detection unit 111, a voltage drop detection unit 112, an overcurrent detection unit 113, an arbiter 114, and a pulse generation circuit 115. The overheat detection unit 111 receives the overheat signal OH and monitors an overheat status of a power semiconductor element. The voltage drop detection unit 112 receives the high-side power supply voltage VB and monitors a drop of the high-side power supply voltage VB. The overcurrent detection unit 113 receives the overcurrent signal OC and monitors an overcurrent status of the power semiconductor element. The arbiter 114 receives an overheat detection signal OHIN from the overheat detection unit 111, a voltage drop detection signal UVIN from the voltage drop detection unit 112, and an overcurrent detection signal OCIN from the overcurrent detection unit 113. The arbiter 114 performs an arbitration operation on these inputted signals and transmits arbitrated signals OHE, UVE, and OCE to the pulse generation circuit 115. The pulse generation circuit 115 controls the PMOS elements PM1 and PM2 by using pulse signals generated on the basis of these signals OHE, UVE, and OCE.

The PMOS elements PM1 and PM2 have drain terminals connected to the low-side circuit 200 and transmit an abnormality signal detected in the high-side circuit 100. The low-side circuit 200 includes a control circuit 210. This control circuit 210 includes a voltage conversion, in-phase noise filter, and pulse generation unit 211, a latch buffer 212, a detection and analysis unit 213, and an alarm output unit 214. The voltage conversion, in-phase noise filter, and pulse generation unit 211 converts an abnormality signal transmitted from the high-side circuit 100 into a voltage, filters in-phase noise, and generates pulses ER1 and ER2. The latch buffer 212 changes its state on the basis of the pulses ER1 and ER2 and outputs signals OHR and OCR. The detection and analysis unit 213 detects and analyzes the inputted signals OHR and OCR and outputs analysis result signals ERDT, OHER, OCER, UVER, and RXER to the alarm output unit 214. The alarm output unit 214 outputs an alarm signal ALM to the terminal ALM in response to these signals.

With this HVIC, when an abnormality such as an overheat, an overcurrent, or a voltage drop is detected in the high-side circuit 100, the pulse generation circuit 115 generates a pulse signal based on the type of the abnormality. This pulse signal is transmitted to the low-side circuit 200 by a level-down circuit including the PMOS elements PM1 and PM2 and the voltage conversion function of the voltage conversion, in-phase noise filter, and pulse generation unit 211. In this way, the low-side circuit 200 is notified of occurrence of an abnormality in the high-side circuit 100.

An outline of how the level-down circuit performs signal transmission will be described by using FIG. 11, which illustrates functions of the pulse generation circuit 115, and FIG. 12, which is a time chart illustrating operations of the pulse generation circuit 115.

FIGS. 11 and 12 illustrate how the pulse generation circuit 115 drives the level-down circuit on the high-side circuit 100 in response to an abnormality detected in the high-side circuit 100. More specifically, when an overcurrent (OC) abnormality is detected, the pulse generation circuit 115 generates a pulse only to the PMOS element PM2. When an overheat (OH) abnormality is detected, the pulse generation circuit 115 generates a pulse only to the PMOS element PM1. In addition, when a voltage drop (UV) abnormality is detected, the pulse generation circuit 115 alternately generates a pulse to the PMOS element PM1 and a pulse to the PMOS element PM2.

By changing the way of outputting a pulse to the level-down circuit in this way, abnormalities that occur in the high-side circuit 100 are distinguished. In the example in FIG. 12, when an abnormality is detected, a corresponding one of or both of the PMOS elements PM1 and PM2 are intermittently operated. This is because continuously maintaining a PMOS element in an on-state causes a current to continuously flow, which is not preferable from a viewpoint of energy saving.

The pulse generation circuit 115 includes a pulse generation unit, which outputs a clock pulse CLK whose period and frequency are constant irrespective of the high-side power supply voltage VB, as illustrated in FIG. 13.

The clock pulse CLK outputted from the pulse generation unit in the conventional HVIC has a constant pulse period and frequency irrespective of change of the high-side power supply voltage VB. However, when the high-side power supply voltage VB drops and when the pulse generation circuit 115 notifies the level-down circuit of voltage drop abnormality signal UVE, the gate voltage ($\Delta$Vgs) of a PMOS element arranged on the high side of the level-down circuit is dropped along with the drop of the high-side power supply voltage VB. Consequently, a current (the drain current of the PMOS element) supplied to the low side when an individual PMOS element is brought in an on-state is decreased. Namely, when the high-side power supply voltage VB is dropped by a certain degree, the pulse period of the clock pulse CLK cannot supply a sufficient amount of charges for changing the signal on the low side. Thus, there is a problem that proper signal transmission to the low side cannot be performed.

SUMMARY OF THE INVENTION

According to one aspect, there is provided a semiconductor element drive apparatus including: a high-side circuit that drives a semiconductor element on an upper-level side of a half-bridge circuit; a low-side circuit that drives a semiconductor element on a lower-level side of the half-bridge circuit; a level-down circuit that notifies the low-side circuit of an abnormality in the high-side circuit; a voltage drop detection unit that detects an abnormal voltage drop of a voltage of a main power supply of the high-side circuit; a pulse generation circuit that generates a pulse signal supplied to the level-down circuit when the voltage drop detection unit detects the abnormal voltage drop, wherein, when the voltage drop detection unit detects the abnormal voltage drop, the pulse generation circuit decreases a frequency of the pulse signal, based on the voltage drop of the main power supply of the high-side circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11 illustrates functions of a pulse generation circuit;

DETAILED DESCRIPTION OF THE INVENTION

Figure 1:
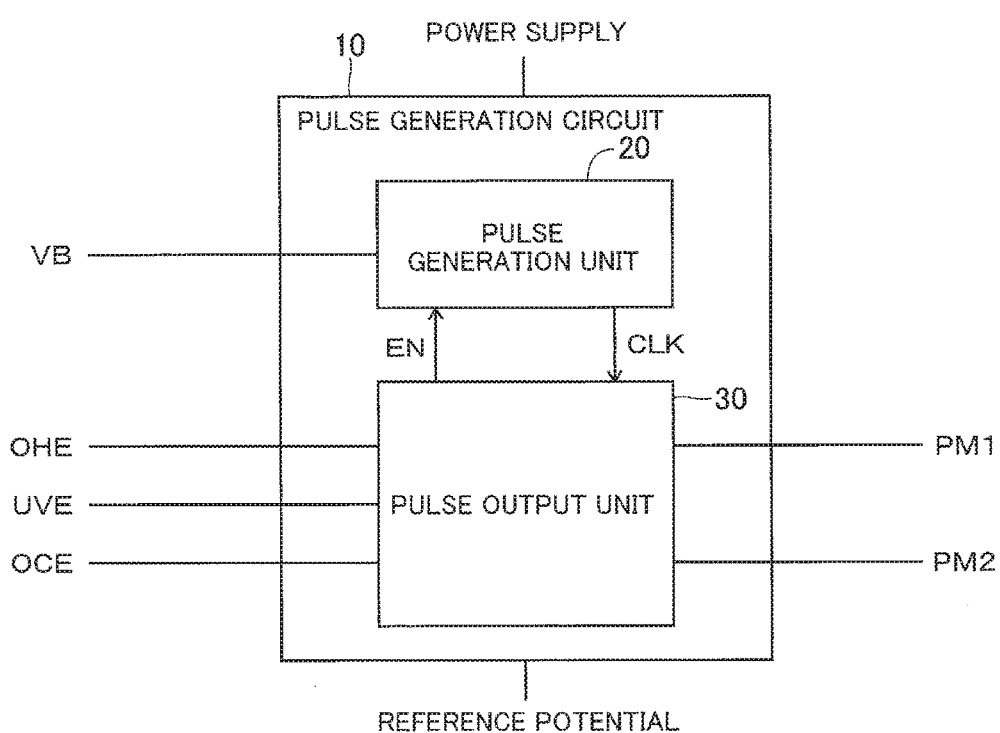
FIG. 1 illustrates a schematic configuration of a pulse generation circuit in a semiconductor element drive device.

Embodiments will be described below by using an HVIC as an example with reference to the accompanying drawings, wherein like reference characters refer to like elements throughout.

FIG. 1 illustrates a schematic configuration of a pulse generation circuit 10 in a semiconductor element drive device.

Figure 10:
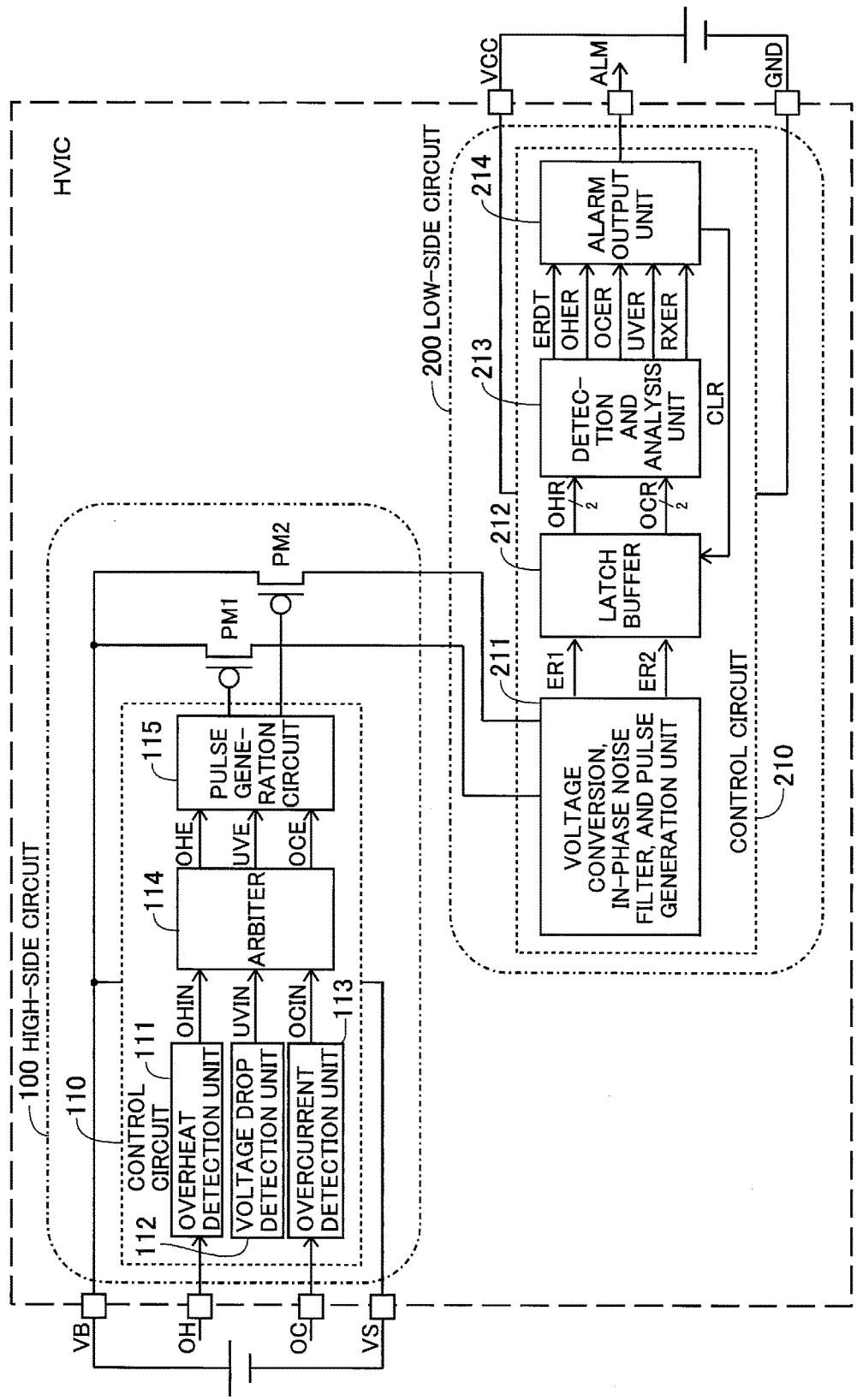
FIG. 10 illustrates a configuration example of a level-down circuit included in an HVIC.
Figure 12:
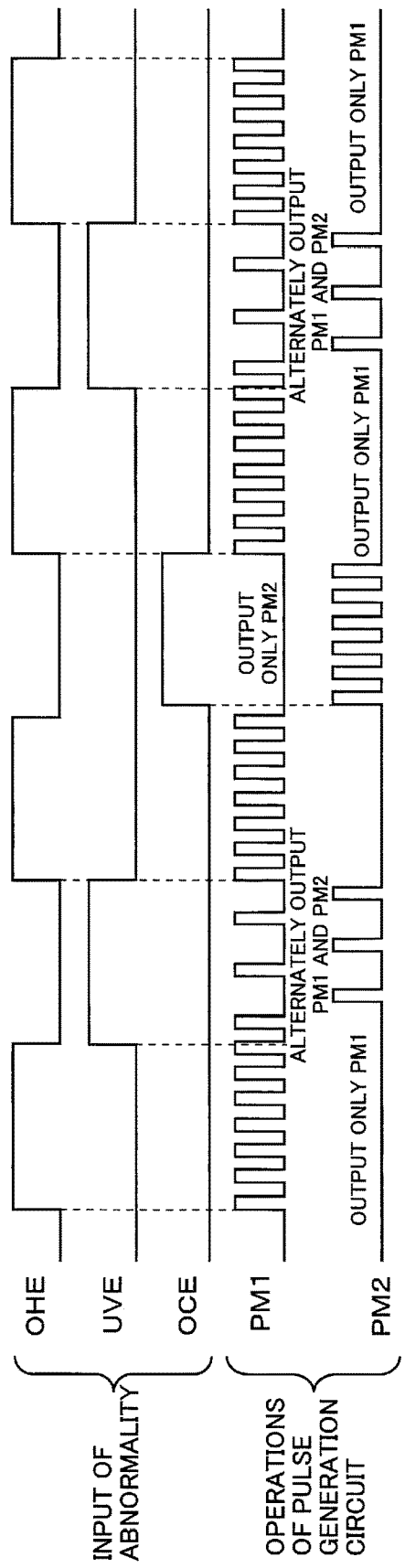
FIG. 12 is a time chart illustrating operations of the pulse generation circuit.
Figure 13:
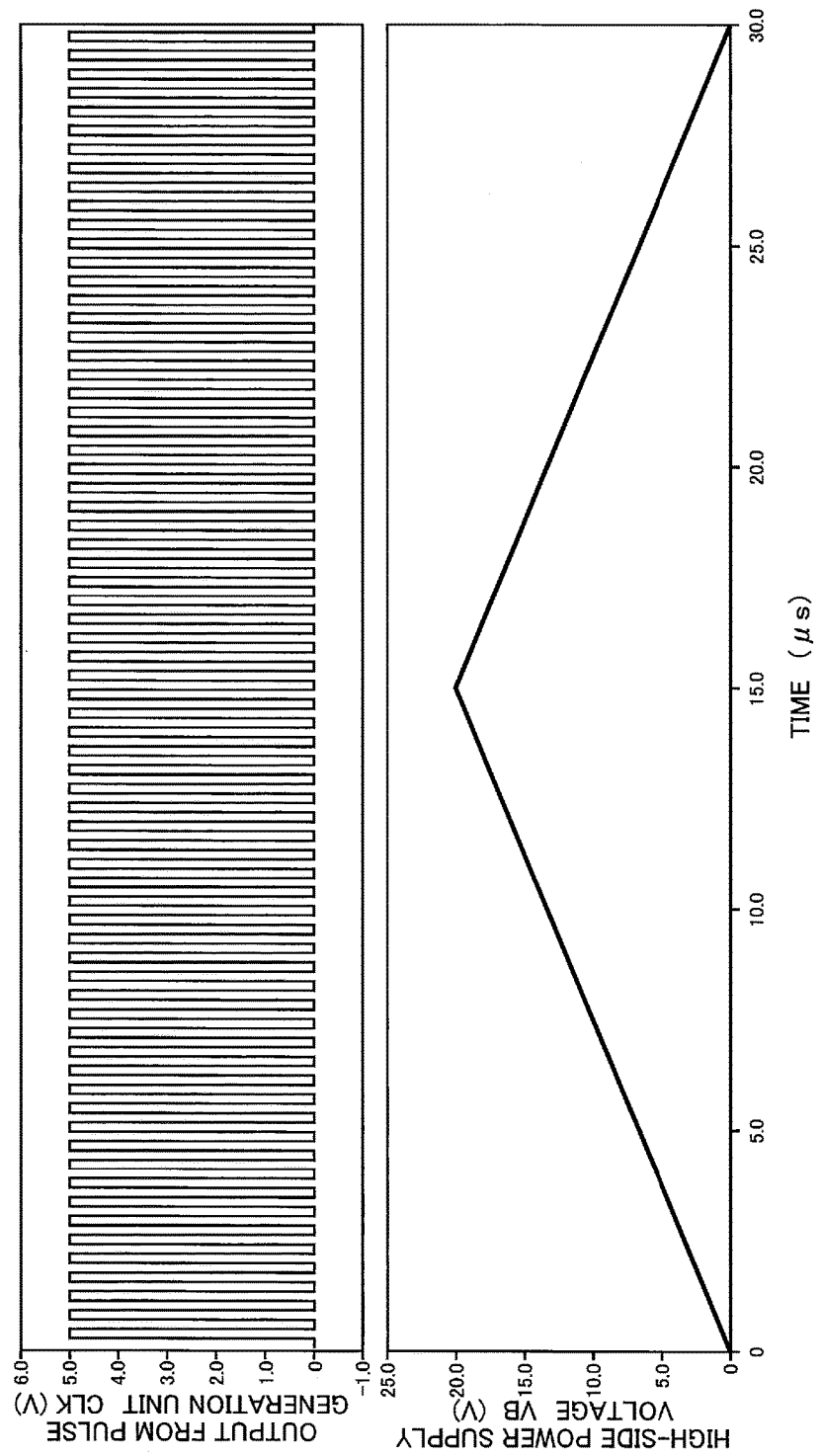
FIG. 13 illustrates an output from a pulse generation unit.

This pulse generation circuit 10 corresponds to the pulse generation circuit 115 included in the control circuit 110 in the high-side circuit 100 in the HVIC illustrated in FIG. 10. The pulse generation circuit 10 includes a pulse generation unit 20 and a pulse output unit 30. A power supply and a reference potential of a high-side circuit are applied to the pulse generation circuit 10.

The pulse generation unit 20 receives a high-side power supply voltage VB and outputs a clock pulse CLK having a pulse frequency based on the high-side power supply voltage VB.

The pulse output unit 30 receives signals OHE, UVE, and OCE outputted from an arbiter and outputs signals PM1 and PM2 for driving PMOS elements PM1 and PM2, respectively, on the basis of the clock pulse CLK outputted from the pulse generation unit 20. The pulse output unit 30 outputs an enable signal EN to the pulse generation unit 20 on the basis of the signals OHE, UVE, and OCE.

First Embodiment

Figure 2:
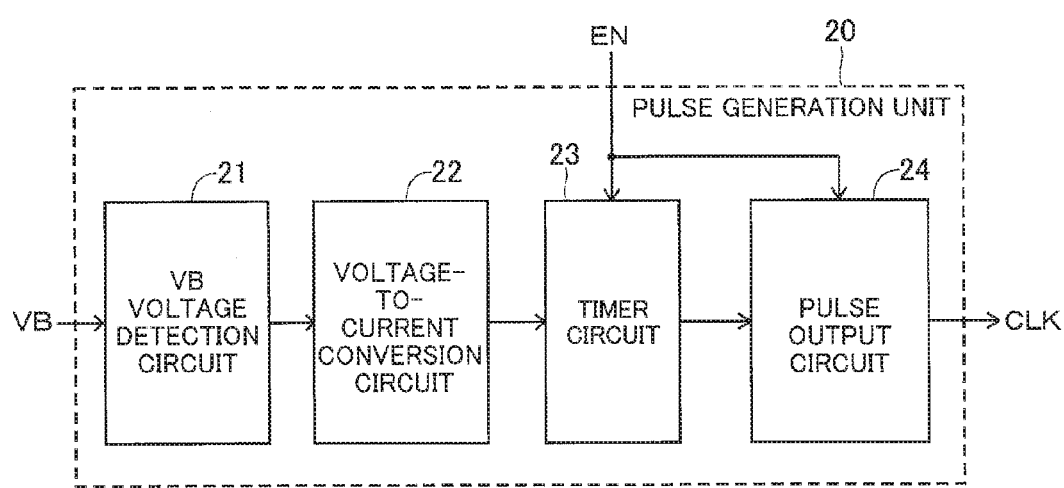
FIG. 2 illustrates a schematic configuration of a pulse generation unit in a semiconductor element drive device according to a first embodiment.
Figure 3:
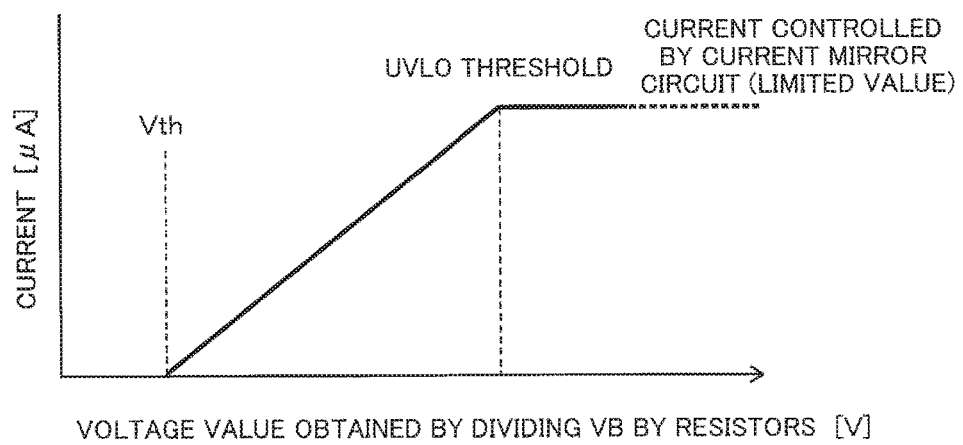
FIG. 3 schematically illustrates voltage-to-current conversion performed by the pulse generation unit.
Figure 4:
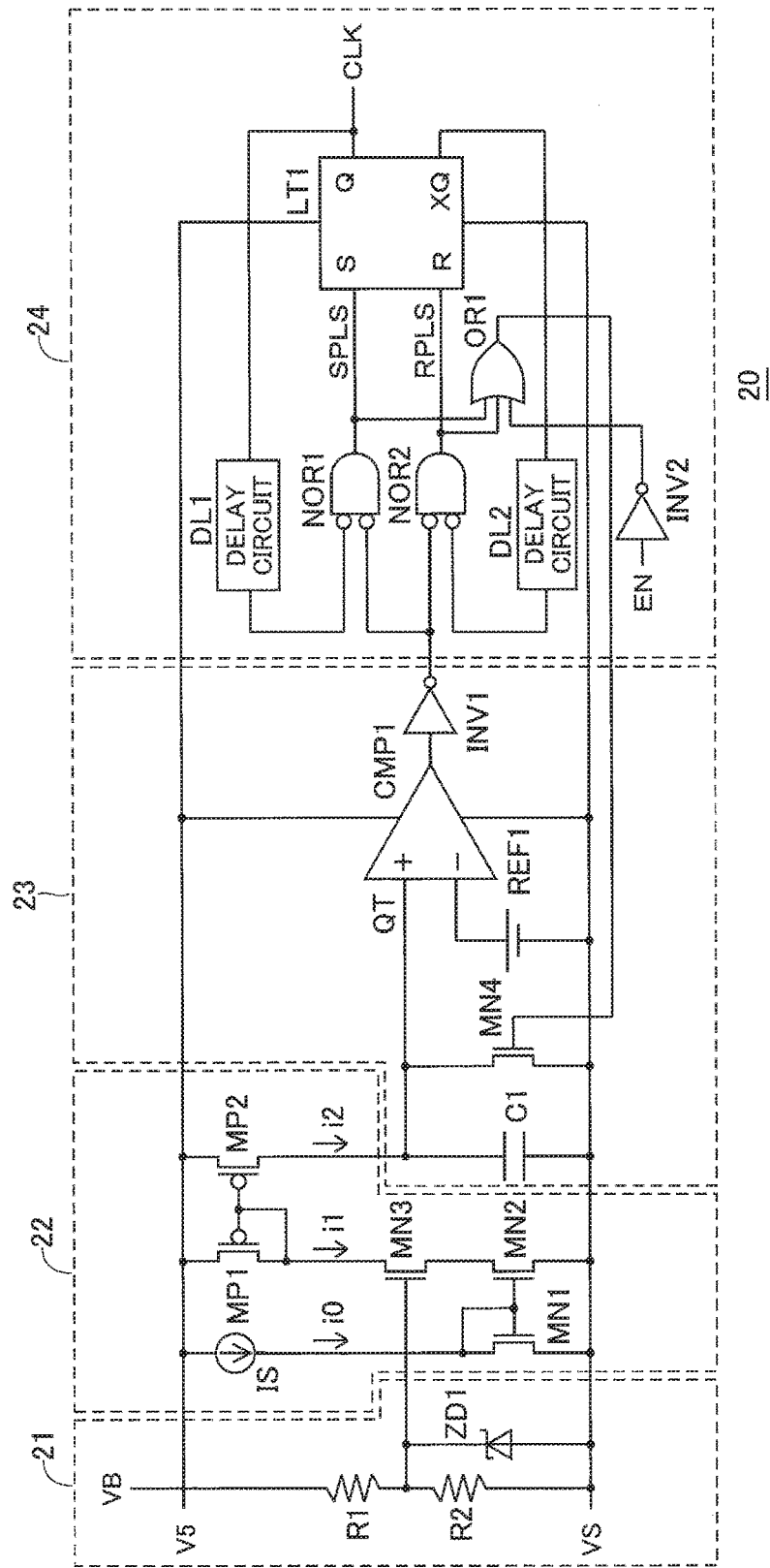
FIG. 4 is a circuit diagram illustrating a configuration example of the pulse generation unit.
Figure 5:
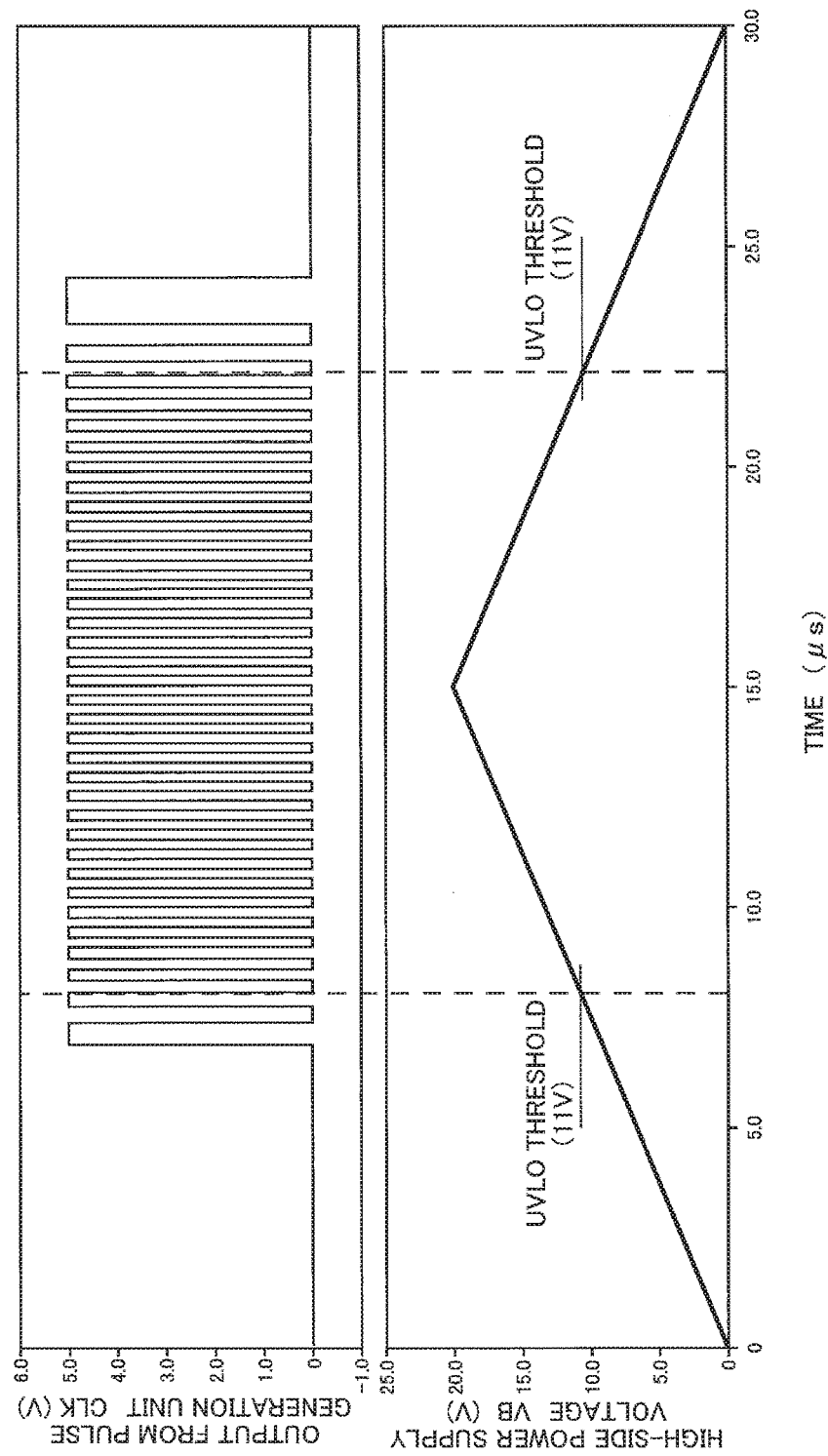
FIG. 5 illustrates an output from the pulse generation unit.

FIG. 2 illustrates a schematic configuration of a pulse generation unit 20 in a semiconductor element drive device according to a first embodiment. FIG. 3 schematically illustrates voltage-to-current conversion performed by the pulse generation unit 20. FIG. 4 is a circuit diagram illustrating a configuration example of the pulse generation unit 20. FIG. 5 illustrates an output from the pulse generation unit 20.

As illustrated in FIG. 2, the pulse generation unit 20 in a pulse generation circuit 10 includes a VB voltage detection circuit 21, a voltage-to-current conversion circuit 22, a timer circuit 23, and a pulse output circuit 24. These circuits are connected in series with each other. The VB voltage detection circuit 21 receives a high-side power supply voltage VB, and the pulse output circuit 24 outputs a clock pulse CLK. The timer circuit 23 and the pulse output circuit 24 receive an enable signal EN from a pulse output unit 30.

As illustrated in FIG. 3, the voltage-to-current conversion circuit 22 converts the high-side power supply voltage VB detected by the VB voltage detection circuit 21 into a current value based on a value corresponding to the voltage. In practice, the high-side power supply voltage VB is divided by resistors in the VB voltage detection circuit 21. This resulting output voltage value is used. If the output voltage value is high, the high-side power supply voltage VB is converted into a predetermined current value. If the output voltage value falls below a voltage value corresponding to an Under Voltage Lock Out (UVLO) threshold, the current is limited by drive capability of an element whose gate receives the output voltage value and is thus decreased. When the output voltage value reaches a threshold voltage Vth of the element receiving the output voltage value, the current reaches zero.

The pulse generation unit 20 having these functions may be configured as illustrated in the circuit diagram in FIG. 4. The VB voltage detection circuit 21 in the pulse generation unit 20 includes resistors R1 and R2 connected in series with each other.

The resistor R1 has one end that receives the high-side power supply voltage VB and the other end that is connected to one end of the resistor R2. The other end of the resistor R2 is connected to a reference potential VS in a high-side circuit. A Zener diode ZD1 is connected in parallel to the resistor R2. This Zener diode ZD1 is used as a protection element so that the control voltage of the element that performs voltage-to-current conversion will not exceed the device breakdown voltage when the high-side power supply voltage VB rises.

The connection between the resistors R1 and R2 is an output node of the VB voltage detection circuit 21 and is connected to the voltage-to-current conversion circuit 22. This voltage-to-current conversion circuit 22 includes a current source IS, NMOS elements MN1 to MN3, and PMOS elements MP1 and MP2.

The NMOS elements MN1 and MN2 form a current mirror circuit. The NMOS element MN1 has drain and gate terminals that are connected to each other, and the drain terminal of the NMOS element MN1 receives a reference current i0 (a constant current) from the current source IS. The NMOS element MN2 has a drain terminal that is connected to a source terminal of the NMOS element MN3. The NMOS element MN3 has a gate terminal that is connected to the connection between the resistors R1 and R2. The NMOS element MN3 has a drain terminal that is connected to drain and gate terminals of the PMOS element MP1. The NMOS element MN3 is the element whose gate terminal receives the voltage value obtained by dividing the high-side power supply voltage VB, and a current i1 based on the high-side power supply voltage VB flows through the PMOS element MP1 as described above. The PMOS elements MP1 and MP2 form a current mirror circuit. The PMOS element MP2 has a drain terminal that serves as an output terminal of the voltage-to-current conversion circuit 22. The PMOS element MP2 outputs a current i2 in proportion to the current i1.

The drain terminal of the PMOS element MP2 is connected to the timer circuit 23. This timer circuit 23 includes a capacitor C1, a comparator CMP1, a reference voltage source REF1, an inverter circuit INV1, and an NMOS element MN4.

The capacitor C1 has one end that is connected to the drain terminal of the PMOS element MP2 and has the other end that is connected to the reference potential VS. The capacitor C1 is configured to integrate (accumulate) the current i2. The one end of the capacitor C1 is also connected to a non-inverting input terminal of the comparator CMP1, which has an inverting input terminal that is connected to the reference voltage source REF1. The comparator CMP1 has an output terminal that is connected to an input terminal of the inverter circuit INV1. In addition, the NMOS element MN4 is connected in parallel to the capacitor C1 so that charges accumulated by the capacitor C1 can be discharged.

The inverter circuit INV1 has an output terminal that is connected to the pulse output circuit 24. This pulse output circuit 24 includes NOR circuits NOR1 and NOR2, delay circuits DL1 and DL2, an OR circuit OR1, a latch circuit (an RS flip flop) LT1, and an inverter circuit INV2.

The output terminal of the inverter circuit INV1 is connected to one input terminal of each of the NOR circuits NOR1 and NOR2. The NOR circuit NOR1 has an output terminal that is connected to a set input terminal S of the latch circuit LT1. The NOR circuit NOR1 outputs a set pulse SPLS. The NOR circuit NOR2 has an output terminal that is connected to a reset input terminal R of the latch circuit LT1. The NOR circuit NOR2 outputs a reset pulse RPLS. The latch circuit LT1 has an output terminal Q that is used as an output terminal of the pulse generation unit 20 that outputs the clock pulse CLK. In addition, the output terminal Q is connected to an input terminal of the delay circuit DL1. The delay circuit DL1 has an output terminal that is connected to the other input terminal of the NOR circuit NOR1. The latch circuit LT1 has an inverting output terminal XQ that is connected to an input terminal of the delay circuit DL2, and the delay circuit DL2 has an output terminal that is connected to the other input terminal of the NOR circuit NOR2. The delay circuits DL1 and DL2 are used for allowing the set pulse SPLS and reset pulse RPLS to have a sufficient pulse width. The output terminals of the NOR circuits NOR1 and NOR2 are connected to first and second input terminals of the OR circuit OR1. The OR circuit OR1 has a third input terminal that is connected to an output terminal of the inverter circuit INV2 whose input terminal receives the enable signal EN. The OR circuit OR1 has an output terminal that is connected to a gate terminal of the NMOS element MN4 included in the timer circuit 23.

The resistors R1 and R2 in the VB voltage detection circuit 21 are set so that the gate voltage of the NMOS element MN3 will not exceed its breakdown voltage when the high-side power supply voltage VB reaches its maximal value (VBmax). Preferably, the ratio of the voltage division performed by the resistors R1 and R2 is set so that the output voltage will be equal to or less than a power supply voltage V5 of the pulse generation unit 20. In order to cause the voltage-to-current conversion circuit 22 in the pulse generation unit 20 to decrease its output current value when the output voltage falls below the UVLO threshold as illustrated in FIG. 3, the ratio of the voltage division performed by the resistors R1 and R2 needs to be adjusted as follows. Namely, (1) A gate voltage VG1 applied when the NMOS element MN1 allows the current i0 to flow therethrough is obtained. In addition, a current that flows through the NMOS element MN2 when the current i0 is flowing through the NMOS element MN1 and when the current is not limited by the NMOS element MN3 is obtained as i10 (if the NMOS elements MN1 and MN2 have the same size, i0=i10).
(2) The drain voltage of the NMOS element MN2 (=the source voltage of the NMOS element MN3) applied when the current in the voltage-to-current conversion circuit 22 begins to decrease is obtained by (VG1−Vth). This is the voltage applied when the NMOS element MN2 switches from a saturated region to a non-saturated region. In addition, Vth represents the threshold voltage of the NMOS elements MN2 and MN3 (this example assumes that the NMOS elements MN2 and MN3 have the same threshold voltage).
(3) The source-gate voltage of the NMOS element MN3 applied when the saturation current i10 is caused to flow through the NMOS element MN3 is obtained as VG2.
(4) The ratio of the voltage division performed by the resistors R1 and R2 is determined so that the gate voltage of the NMOS element MN3 applied when the high-side power supply voltage VB reaches the UVLO threshold will be (VG1−Vth+VG2).

In addition, the on-resistance of the NMOS element MN3 in the voltage-to-current conversion circuit 22 is set to be smaller than the on-resistance of the NMOS element MN2 so that the current i0 can be copied to obtain a sufficient value as the current i1.

With the pulse generation unit 20 configured as described above, when the voltage obtained by the resistors R1 and R2 that divides the high-side power supply voltage VB represents a normal value that is higher than the UVLO threshold, the NMOS element MN3 is maintained in an on-state. As a result, the current bias input value (i0) is sequentially copied by the NMOS elements MN1 and MN2 and PMOS elements MP1 and MP2 forming current mirror circuits, and as a result, the current i2 flows. The current ratio of an individual current mirror circuit is determined based on conditions of the timer circuit 23 (the capacitor C1, the reference voltage source REF1, the frequency of the clock pulse CLK).

The current i2 obtained by the voltage-to-current conversion circuit 22 is integrated by the capacitor C1. A voltage QT across the capacitor C1 is determined by the value of the current i2, the capacitance value of the capacitor C1, and the accumulation time t (the maximal value is half of the frequency of the clock pulse CLK). This voltage QT is inputted to the comparator CMP1 and compared with a reference voltage REF1 of the reference voltage source REF1.

When the voltage QT is lower than the reference voltage REF1, the output terminal of the comparator CMP1 is dropped to the low level, and the inverter circuit INV1 outputs a high-level signal. Accordingly, since the output terminals of the NOR circuits NOR1 and NOR2 are dropped to the low level, the latch circuit LT1 maintains its internal state and output.

When the voltage QT reaches the reference voltage REF1, the output terminal of the comparator CMP1 is increased to the high level, and the inverter circuit INV1 outputs a low-level signal. Accordingly, since the NOR circuit NOR1 outputs the set pulse SPLS or the NOR circuit NOR2 outputs the reset pulse RPLS in accordance with the output state of the latch circuit LT1 (if an output Q is at a low level, the NOR circuit NOR1 outputs the set pulse SPLS and if an output XQ is at a low level, the NOR circuits NOR2 outputs the reset pulse RPLS), the state of the latch circuit LT1 is inverted, and the clock pulse CLK is inverted. In addition, when the set pulse SPLS or the reset pulse RPLS is outputted, the OR circuit OR1 turns on the NMOS element MN4 to discharge charges accumulated by the capacitor C1 to the reference potential VS.

This capacitor C1 is also discharged by the NMOS element MN4 when the enable signal EN inputted to the inverter circuit INV2 from the pulse output unit 30 is switched from a high level (an enabled state: detection of an abnormality) to a low level (disabled state). While the enable signal EN is maintained in a low-level state (disabled state), since the voltage QT of the capacitor C1 is maintained at the reference potential VS, the timer circuit 23 is not in operation.

As described above, when the high-side power supply voltage VB is over the UVLO threshold, the capacitor C1 is always charged by the constant current i2. Thus, the pulse generation unit 20 outputs the clock pulse CLK having a constant frequency, as illustrated in FIG. 5.

Next, when the high-side power supply voltage VB falls below the UVLO threshold and an abnormal voltage drop occurs, the NMOS element MN3 operates to decrease the current i1 along with the drop of the high-side power supply voltage VB. Consequently, since the current i2 copied by the current mirror circuit formed by the PMOS elements MP1 and MP2 is decreased, and the charging current of the capacitor C1 is also decreased. As a result, the pulse width of the clock pulse CLK generated by the pulse output circuit 24 is widened, and the pulse generation unit 20 outputs the clock pulse CLK having a lower frequency, as illustrated in FIG. 5.

When the high-side power supply voltage VB is dropped and the output voltage from the VB voltage detection circuit 21 reaches the threshold voltage Vth of the NMOS element MN3, the NMOS element MN3 is brought in a high-impedance state. Thus, the current i1 stops flowing, and as a result, the timer circuit 23 is stopped.

Figure 6:
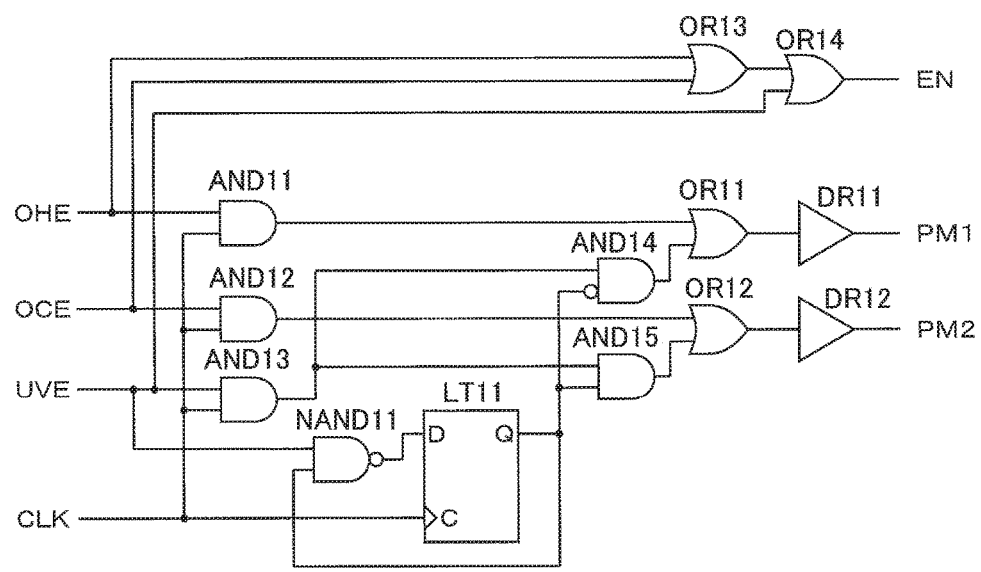
FIG. 6 is a circuit diagram illustrating a configuration example of a pulse output unit.

FIG. 6 is a circuit diagram illustrating a configuration example of the pulse output unit 30.

The pulse output unit 30 includes AND circuits AND11 to AND15, a NAND circuit NAND11, a latch circuit (a D flip flop) LT11, OR circuits OR11 to OR14, and drive circuits DR11 and DR12.

Each of the AND circuits AND11 to AND13 has one input terminal that receives a corresponding one of the abnormality detection signals OHE, UVE, and OCE and the other input terminal that receives the clock pulse CLK from the pulse generation unit 20. The AND circuit AND11 has an output terminal that is connected to one input terminal of the OR circuit OR11, and the AND circuit AND12 has an output terminal that is connected to one input terminal of the OR circuit OR12. The OR circuits OR11 and OR12 have output terminals that are connected to input terminals of the drive circuits DR11 and DR12, respectively. The drive circuits DR11 and DR12 have output terminals that are connected to gate terminals of the PMOS elements PM1 and PM2 in the level-down circuit, respectively.

The AND circuit AND13 has an output terminal that is connected to one input terminal of each of the AND circuits AND14 and AND15. The AND circuit AND14 has an output terminal that is connected to the other input terminal of the OR circuit OR11. The AND circuit AND15 has an output terminal that is connected to the other input terminal of the OR circuit OR12.

The NAND circuit NAND11 has one input terminal that receives the signal UVE and the other input terminal that is connected to an output terminal Q of the latch circuit LT11. The NAND circuit NAND11 has an output terminal that is connected to a data input terminal D of the latch circuit LT11. The latch circuit LT11 has a clock input terminal C that receives the clock pulse CLK.

The output terminal Q of the latch circuit LT11 is connected to the other input terminal (the inverting input terminal) of the AND circuit AND14 and to the other input terminal of the AND circuit AND15.

The OR circuit OR13 has one input terminal that receives the signal OHE and the other input terminal that receives the signal OCE. The OR circuit OR13 has an output terminal that is connected to one input terminal of the OR circuit OR14. The OR circuit OR14 has the other input terminal that receives the signal UVE and has an output terminal that transmits the enable signal EN to the pulse generation unit 20.

When there is no abnormality on the high side of the HVIC, all the signals OHE, UVE, and OCE received by the pulse output unit 30 are maintained at a low level. Thus, the enable signal EN is also maintained at a low level, and the timer circuit 23 in the pulse generation unit 20 that receives this enable signal EN is not in operation. Namely, the pulse generation unit 20 does not output the clock pulse CLK.

In addition, since one of the input terminals of each of the AND circuits AND11 to AND13 is at a low level, the output terminals of the AND circuits AND11 to AND13 are also at a low level. In addition, since one of the input terminals of each of the AND circuits AND14 and AND15 also receives a low level signal from the AND circuit AND13, the output terminals of the AND circuits AND14 and AND15 are also at a low level. Thus, since both the input terminals of each of the OR circuits OR11 and OR12 are at a low level, the drive circuits DR11 and DR12 are supplied with a low-level signal.

When the signal UVE is at a low level, if an overheat or overcurrent abnormality occurs, the signal OHE or OCE is increased to a high level. Accordingly, since the enable signal EN is increased to a high level, the terminal CLK receives the clock pulse CLK from the pulse generation unit 20. In this state, since the AND circuits AND13 to AND15 output a low-level signal, the OR circuits OR11 and OR12 receive signals only from the AND circuits AND11 and AND12, respectively.

When the AND circuit AND11 receives the signal OHE at a high level, the AND circuit AND11 outputs the same signal as the clock pulse CLK, and this signal is transmitted to the PMOS element PM1 in the level-down circuit via the OR circuit OR11 and the drive circuit DR11.

In contrast, when the AND circuit AND12 receives the signal OCE at a high level, the AND circuit AND12 outputs the same signal as the clock pulse CLK, and this signal is transmitted to the PMOS element PM2 in the level-down circuit via the OR circuit OR12 and the drive circuit DR12.

When the signals OHE and OCE are at a low level, if an abnormal voltage drop occurs, the signal UVE is increased to a high level. Accordingly, since the enable signal EN is increased to a high level, the terminal CLK receives the clock pulse CLK from the pulse generation unit 20. In this state, since the AND circuits AND11 and AND12 output a low-level signal, the OR circuits OR11 and OR12 receive signals only from the AND circuits AND14 and AND15, respectively.

Since one input terminal of the AND circuit AND13 receives the high-level signal UVE and the other input terminal thereof receives the clock pulse CLK, the AND circuit AND13 outputs the same signal as the clock pulse CLK to one of the input terminals of each of the AND circuits AND14 and AND15. Meanwhile, each time the latch circuit LT11 receives the clock pulse CLK, the latch circuit LT11 reads the logical state of the data input terminal D and outputs the read logical state. In addition, since one input terminal of the NAND circuit NAND11 receives the signal UVE at a high level and the other input terminal thereof receives the output signal of the latch circuit LT11, the NAND circuit NAND11 outputs a signal whose logical state is opposite to that of the output signal of the latch circuit LT11. Namely, each time the latch circuit LT11 receives the clock pulse CLK, the logical state of the output terminal Q is changed (inverted). The output signal of the latch circuit LT11 is simultaneously inputted to the other input terminal of the each of the AND circuits AND14 and AND15. However, since the other input terminal of the AND circuit AND14 is a negative logic input, each time the logical state of the output signal of the latch circuit LT11 is changed, the AND circuits AND14 and AND15 alternately open their respective gates. As a result, the OR circuits OR11 and OR12 alternately output the pulse signals PM1 and PM2 to the drive circuits DR11 and DR12, respectively. Each of the pulse signals PM1 and PM2 has a pulse period twice that of the clock pulse CLK and has a frequency half of that of the clock pulse CLK.

In the pulse generation unit 20, the output pulse width of the clock pulse CLK has been modulated by changing the measurement time of the timer circuit 23 on the basis of the high-side power supply voltage VB. Namely, when the high-side power supply voltage VB falls below the UVLO threshold, the pulse width is widened along with the drop of the high-side power supply voltage VB and is narrowed along with the rise of the high-side power supply voltage VB. In this way, even when the high-side power supply voltage VB drops and the amount of current supplied to the PMOS elements PM1 and PM2 included in the level-down circuit is decreased, since the amount of charges supplied is increased by the widened pulse width, signal transmission to the low-side circuit is achieved without fail.

Second Embodiment

Figure 7:
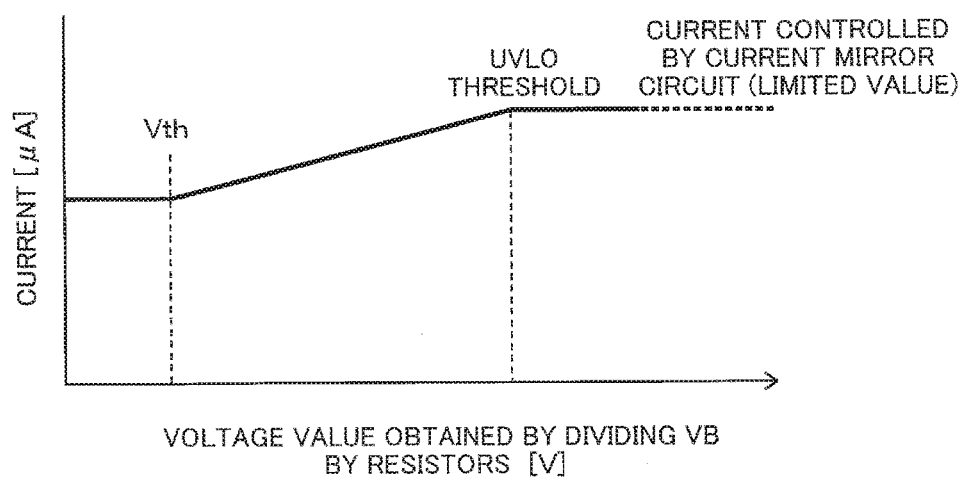
FIG. 7 schematically illustrates voltage-to-current conversion performed by a pulse generation unit according to a second embodiment.
Figure 8:
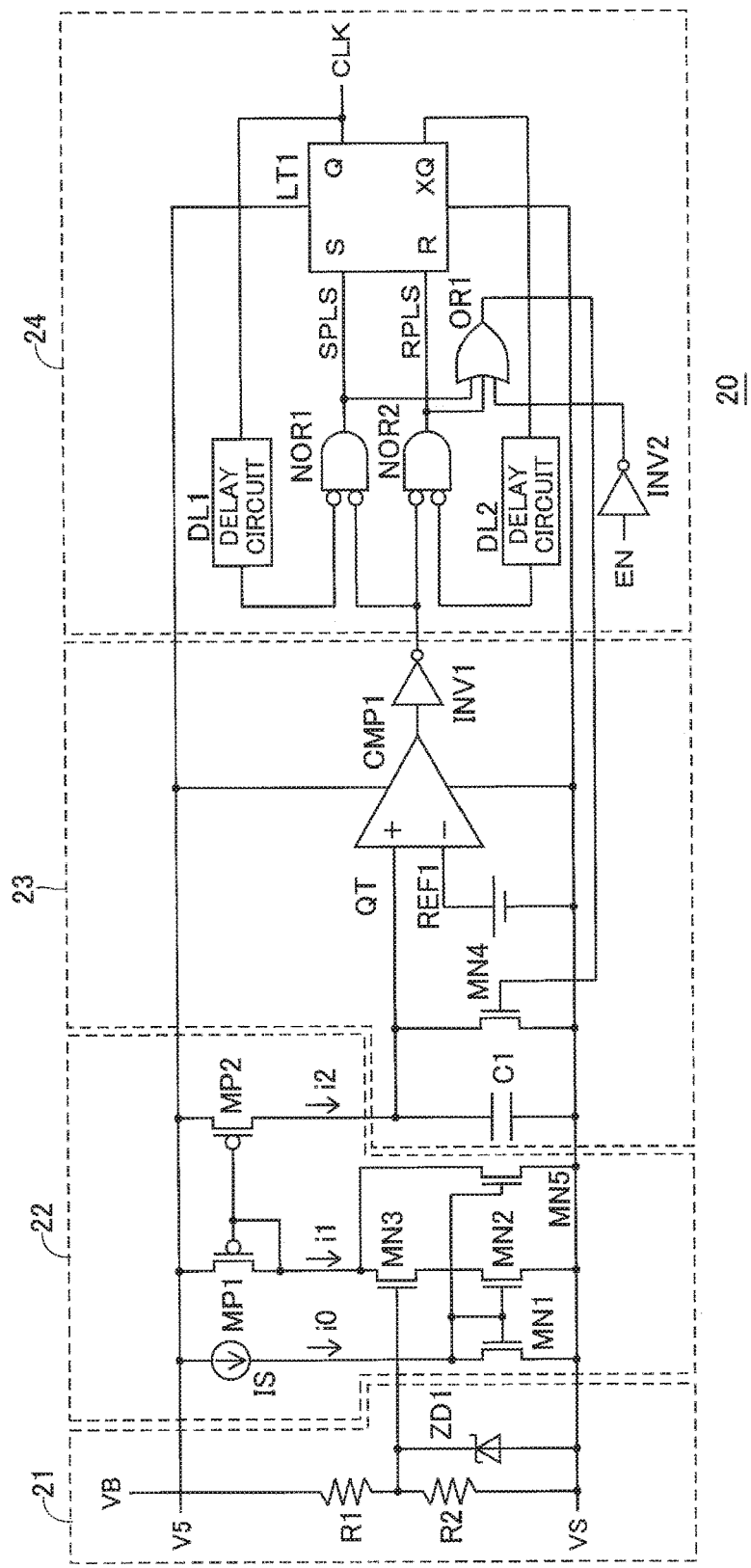
FIG. 8 is a circuit diagram illustrating a configuration example of the pulse generation unit according to the second embodiment.
Figure 9:
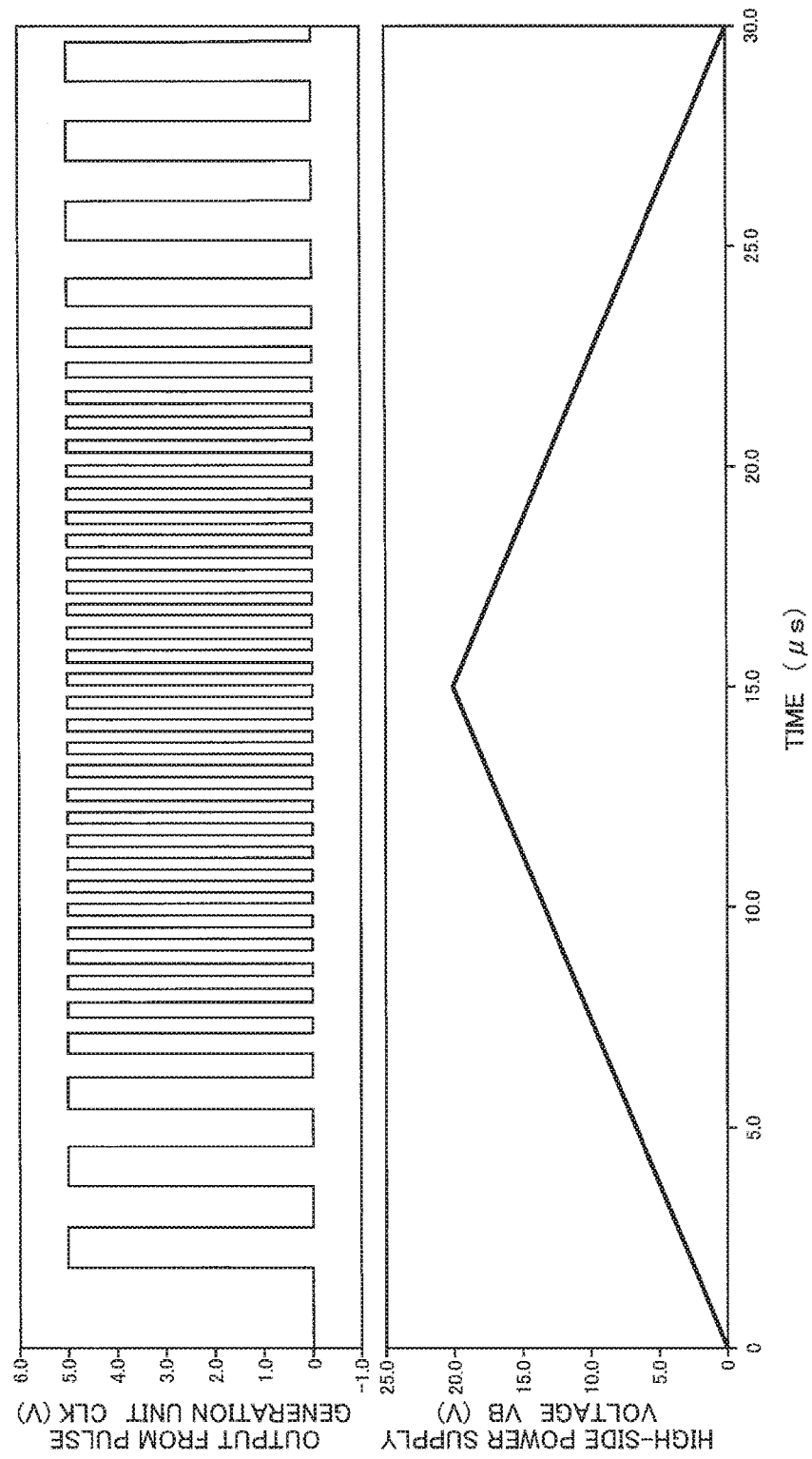
FIG. 9 illustrates an output from the pulse generation unit according to the second embodiment.

FIG. 7 schematically illustrates voltage-to-current conversion performed by a pulse generation unit according to a second embodiment. FIG. 8 is a circuit diagram illustrating a configuration example of the pulse generation unit. FIG. 9 illustrates an output from the pulse generation unit. In FIG. 8, the same elements as those in FIG. 4 will be denoted by the same reference characters as those in FIG. 4, and detailed description thereof will be omitted. In addition, since a semiconductor element drive device according to the second embodiment is configured in the same way as the semiconductor element drive device according to the first embodiment except the pulse generation unit 20, description of the same configuration will be omitted.

In the semiconductor element drive device according to the second embodiment, as illustrated in FIG. 7, when the high-side power supply voltage VB drops from the UVLO threshold to the threshold voltage Vth, the voltage-to-current conversion circuit 22 in the pulse generation unit 20 converts the high-side power supply voltage VB into a current having a minimum value other than zero. Namely, when the voltage value obtained by the voltage division performed by the resistors in the VB voltage detection circuit 21 is high, the voltage-to-current conversion circuit 22 outputs a predetermined current value. When the voltage value obtained by the voltage division falls below the UVLO threshold, the current is accordingly decreased. When the voltage value obtained by the voltage division reaches the threshold voltage Vth of the element that receives the voltage value obtained by the voltage division, the current outputted by the element reaches zero. However, even in such cases, a path through which a current of a minimum value other than zero flows is ensured.

As illustrated in FIG. 8, the pulse generation unit 20 having the voltage-to-current conversion circuit 22 with the above characteristics is configured differently from the pulse generation unit 20 in FIG. 4. Namely, an NMOS element MN5 is additionally connected in parallel to the NMOS elements MN2 and MN3 connected in series with each other. The NMOS element MN5 has a gate terminal connected to the gate terminals of the NMOS elements MN1 and MN2 forming a current mirror circuit. The NMOS elements having the same threshold voltage are used as the NMOS elements MN1, MN2, MN3, and MN5.

By adding the NMOS element MN5 and causing part of the current i1 to always flow through the NMOS element MN5, the voltage drop range of the high-side power supply voltage VB in which the clock pulse CLK is outputted is widened, as illustrated in FIG. 9. By allowing the NMOS element MN5 to define the minimum value of the current i1 flowing through the current mirror circuit, the minimum value of the frequency of the clock pulse CLK is set. In this case, too, when the high-side power supply voltage VB is dropped and when the amount of current supplied to the PMOS elements PM1 and PM2 included in the level-down circuit is decreased, the decrease of the current supply amount is supplemented by widening the pulse width. Thus, signal transmission to the low-side circuit is achieved without fail.

In the above embodiments, when the high-side power supply voltage VB drops, the pulse generation unit 20 generates the clock pulse CLK whose frequency has been modulated, and the level-down circuit transmits the voltage drop abnormality of the high-side power supply voltage VB to the low-side circuit by using the clock pulse CLK. However, the clock pulse CLK whose frequency is changeable is not only used for transmitting the voltage drop abnormality. The clock pulse CLK is similarly used for transmitting other abnormalities such as overheat and overcurrent abnormalities to the low-side circuit. In this way, for example, even when an overheat or overcurrent abnormality occurs and the high-side power supply voltage VB is dropped, the overheat or overcurrent abnormality is transmitted to the low-side circuit without fail.

With an individual one of the semiconductor element drive devices configured as described above, when a voltage drop abnormality of a main power supply in the high-side circuit is detected, the frequency of the clock pulse is lowered, and the pulse width is widened. In this way, even when the voltage of the main power supply in the high-side circuit is dropped, the decrease of the amount of charges supplied to the level-down circuit is suppressed. Namely, an abnormality in the high-side circuit is transmitted to the low side circuit without fail.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor element drive apparatus for driving first and second semiconductor elements connected to a half-bridge circuit at respectively an upper-level side and a lower-level side of the half-bridge circuit, the semiconductor element drive apparatus comprising:
   a high-side circuit and a low-side circuit that respectively drive the first and second semiconductor elements, wherein
   the high-side circuit includes a voltage drop detection unit that receives a voltage of a main power supply, and detects an abnormal voltage drop of the received voltage, to thereby generate a first abnormality signal, a pulse generation circuit that receives the first abnormality signal, to thereby generate a pulse signal, a frequency of which is decreased in response to the abnormal voltage drop detected by the voltage drop detection unit, and a level-down circuit that receives the pulse signal from the pulse generation circuit to thereby generate a second abnormality signal, and transmits the second abnormality signal to the low-side circuit, to thereby notify the low-side circuit of the abnormal voltage drop in the high-side circuit.

2. The semiconductor element drive apparatus according to claim 1, wherein the pulse generation circuit includes:

a pulse generation unit that receives the voltage of the main power supply, and generates a clock pulse having a frequency based on the voltage of the main power supply; and a pulse output unit that receives the first abnormality signal, and generates and outputs the pulse signal based on the first abnormality signal and the clock pulse.

3. A semiconductor element drive apparatus for driving first and second semiconductor elements connected to a half-bridge circuit at respectively an upper-level side and a lower-level side of the half-bridge circuit, the semiconductor element drive apparatus comprising:

a high-side circuit and a low-side circuit that respectively drive the first and second semiconductor elements, wherein the high-side circuit includes
a voltage drop detection unit that receives a voltage of a main power supply, and detects an abnormal voltage drop of the received voltage, to thereby generate a first abnormality signal, a pulse generation circuit that receives the first abnormality signal, to thereby generate a pulse signal, a frequency of which is decreased in response to the abnormal voltage drop detected by the voltage drop detection unit, and a level-down circuit that receives the pulse signal from the pulse generation circuit to thereby generate a second abnormality signal, and transmits the second abnormality signal to the low-side circuit, to thereby notify the low-side circuit of the abnormal voltage drop in the high-side circuit, wherein the pulse generation circuit includes:
a pulse generation unit that receives the voltage of the main power supply, and generates a clock pulse having a frequency based on the voltage of the main power supply; and a pulse output unit that receives the first abnormality signal, and generates and outputs the pulse signal based on the first abnormality signal and the clock pulse, wherein the pulse generation unit includes:
a main power supply voltage detection circuit that divides the voltage of the main power supply in a predetermined voltage division ratio and outputs a resulting voltage;

a voltage-to-current conversion circuit that receives the resulting voltage, and outputs, upon detecting that the voltage of the main power supply falls below an under-voltage lock-out threshold, a current that has a value based on the voltage of the main power supply;

a timer circuit having a capacitor, the timer circuit receiving the current and generating the clock pulse by charging or discharging the capacitor; and a pulse output circuit that outputs the clock pulse generated by the timer circuit to the pulse output unit.

4. The semiconductor element drive apparatus according to claim 3, wherein the voltage-to-current conversion circuit includes:

a first current mirror circuit including a pair of first and second n-channel metal-oxide-semiconductor field-effect transistor (NMOS) elements;

a second current mirror circuit including a pair of first and second p-channel metal-oxide-semiconductor field-effect transistor (PMOS) elements; and a third NMOS element formed between the first and second current mirror circuits, the third NMOS element having a gate terminal that receives the resulting voltage outputted by the main power supply voltage detection circuit, wherein the third NMOS element controls a current transmitted from the first current mirror circuit to the second current mirror circuit based on the resulting voltage outputted by the main power supply voltage detection circuit, and changes the value of the current outputted to the timer circuit.

5. The semiconductor element drive apparatus according to claim 4, wherein the second and third NMOS elements are connected in series with each other, the semiconductor element drive apparatus further includes a fourth NMOS element, which is connected in parallel to the second and third NMOS elements and has a gate terminal connected to gate terminals of the first and second NMOS elements, and a lowest value of the frequency of the clock pulse generated by the timer circuit is determined by a minimum current that flows through the first and second current mirror circuits.

* * * * *